(12) United States Patent
Hsiao

(10) Patent No.: US 11,895,830 B2
(45) Date of Patent: Feb. 6, 2024

(54) METHOD FOR MANUFACTURING SEMICONDUCTOR DEVICE

(71) Applicant: NANYA TECHNOLOGY CORPORATION, New Taipei (TW)

(72) Inventor: Chuan-Lin Hsiao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 262 days.

(21) Appl. No.: 17/541,817

(22) Filed: Dec. 3, 2021

(65) Prior Publication Data

US 2023/0180466 A1 Jun. 8, 2023

(51) Int. Cl.
| | |
|---|---|
| *H10B 12/00* | (2023.01) |
| *H01L 29/423* | (2006.01) |
| *H01L 29/40* | (2006.01) |
| *H01L 21/762* | (2006.01) |

(52) U.S. Cl.
CPC ..... *H10B 12/488* (2023.02); *H01L 21/76224* (2013.01); *H01L 29/401* (2013.01); *H01L 29/4236* (2013.01); *H10B 12/053* (2023.02)

(58) Field of Classification Search
CPC .. H10B 12/0387; H10B 12/053; H10B 12/05; H10B 12/488; H01L 29/4236
See application file for complete search history.

(56) References Cited

U.S. PATENT DOCUMENTS

| | | | | |
|---|---|---|---|---|
| 2019/0027480 | A1* | 1/2019 | Lee | H01L 29/66659 |
| 2021/0343846 | A1* | 11/2021 | Ping | H10B 12/053 |
| 2022/0077154 | A1 | 3/2022 | Kim et al. | |
| 2022/0173112 | A1* | 6/2022 | Kim | H10B 12/34 |
| 2023/0178614 | A1* | 6/2023 | Hsiao | H01L 29/4236 |
| | | | | 257/330 |

OTHER PUBLICATIONS

Office Action dated Jan. 25, 2023 related to U.S. Appl. No. 17/544,410.

* cited by examiner

*Primary Examiner* — Joseph C. Nicely
(74) *Attorney, Agent, or Firm* — Xuan Zhang

(57) ABSTRACT

The present disclosure provides a method for manufacturing a semiconductor device having a buried wordline. The method includes forming a first recessed portion in a first dielectric layer in a substrate; forming a second recessed portion spaced apart from the first recessed portion and in the substrate; disposing a protection layer on the substrate to cover the second recessed portion; and disposing a second dielectric layer on the first dielectric layer.

17 Claims, 22 Drawing Sheets

METHOD FOR MANUFACTURING SEMICONDUCTOR DEVICE

TECHNICAL FIELD

The present disclosure relates to a method for manufacturing a semiconductor device, and more particularly, to a method for manufacturing a semiconductor device having a buried wordline.

DISCUSSION OF THE BACKGROUND

In a dynamic random access memory (DRAM) device, the memory cells are addressed by wordlines. Interference between wordlines in different memory cells should be avoided to reduce storage node leakage (e.g., junction leakage and sub-threshold leakage) and to retain the charge written to the cell capacitor.

As DRAM devices become more highly integrated, it becomes more difficult to isolate one wordline (which may be referred to as an active wordline) in a memory cell from another wordline (which may be referred to as a passing wordline) in an adjacent memory cell. The junction leakage current may be accelerated by trap-assisted tunneling generated by an internal electric field when a passing wordline is turned on.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate having a surface and a first dielectric layer extending from the surface of the substrate into the substrate. The semiconductor device also includes a second dielectric layer disposed on the first dielectric layer and extending from the surface of the substrate into the substrate and a first conductive layer disposed in the substrate and separated from the substrate by the first dielectric layer and the second dielectric layer.

Another aspect of the present disclosure provides a semiconductor device. The semiconductor device includes a substrate having a surface, a first dielectric layer extending from the surface of the substrate into the substrate, and a first conductive layer disposed in the substrate and separated from the substrate by the first dielectric layer. The semiconductor device also includes a second dielectric layer extending from the surface of the substrate into the substrate and a second conductive layer disposed in the substrate and separated from the substrate by the second dielectric layer. The first dielectric layer and the second dielectric layer have different thicknesses.

Another aspect of the present disclosure provides a method of manufacturing a semiconductor device. The method includes forming a first recessed portion in a first dielectric layer in a substrate and forming a second recessed portion spaced apart from the first recessed portion and in the substrate. The method also includes disposing a protection layer on the substrate to cover the second recessed portion and disposing a second dielectric layer on the first dielectric layer.

By forming two dielectric layers between the conductive layer and the substrate, the effective electric field may be reduced and hence the junction leakage current may be lowered. Therefore, interference between wordlines in different memory cells can be avoid and the charge written to the cell capacitor can be retained.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
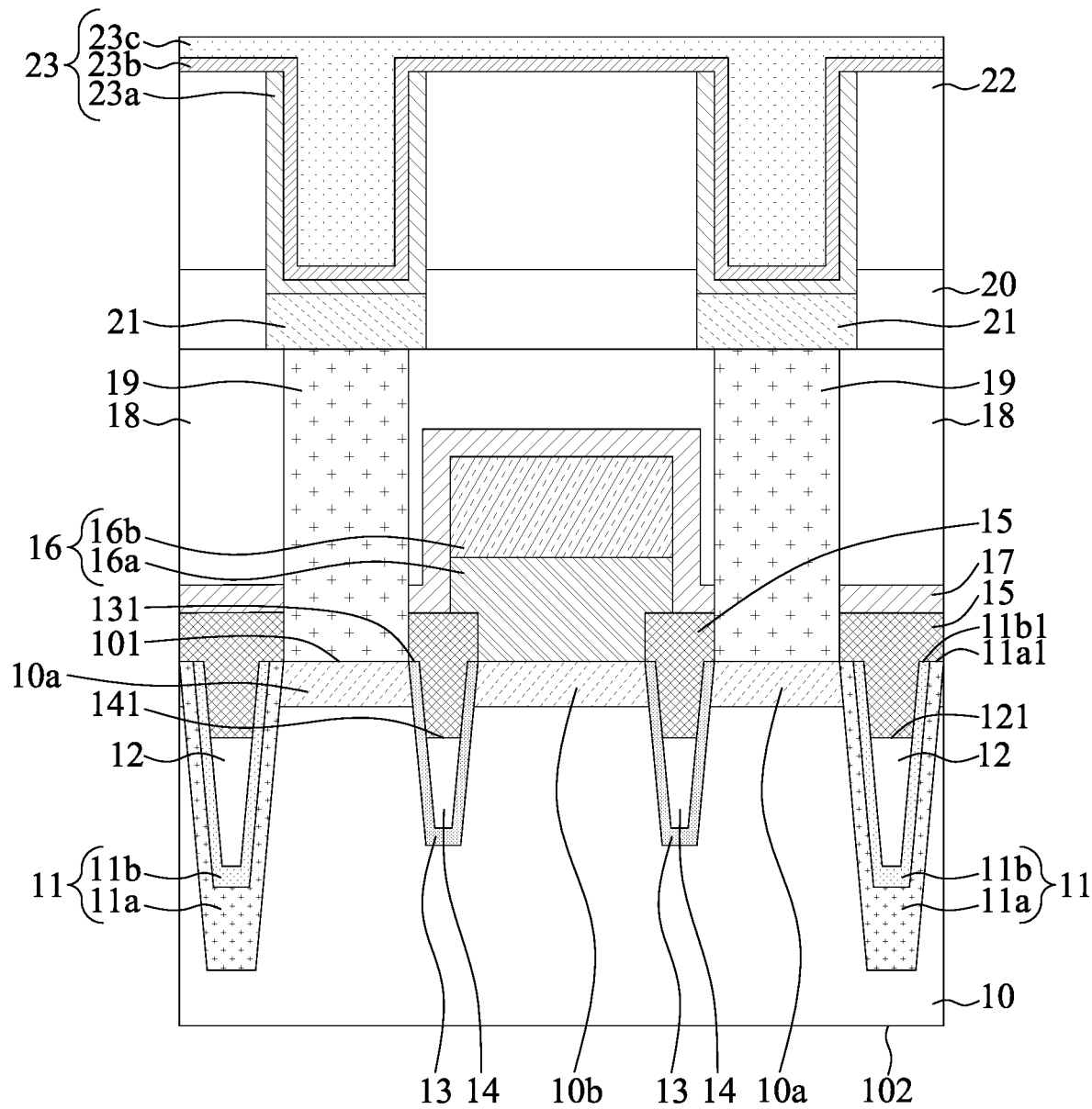
FIG. 1 is a schematic cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a cross-sectional view of a semiconductor device 1 in accordance with some embodiments of the present disclosure. In some embodiments, the semiconductor device 1 may include a circuit, such as a memory cell. In some embodiments, the memory cell may include a dynamic random access memory cell (DRAM cell). As shown in FIG. 1, in some embodiments, the semiconductor device 1 may include a substrate 10, diffusion regions 10a, 10b, dielectric layers 11, 13, conductive layers 12, 14, and an insulating layer 15.

In some embodiments, the conductive layers 12 and 14 may function as wordlines. For example, the conductive layers 12 and 14 may be used with bitlines (such as a bitline 16 shown in FIG. 1) to address memory cells. For example, the conductive layer 14 may function as a gate electrode of a transistor in a memory cell. The diffusion region 10a and the diffusion region 10b may function as a drain region and a source region of the transistor. The diffusion region 10a may be coupled to a capacitor (such as a capacitor 23 shown in FIG. 1) and the diffusion region 10b may be coupled to a bitline (such as the bitline 16 shown in FIG. 1). The transistor may retain charge in the capacitor. Similarly, the conductive layer 12 may function as a gate electrode of a transistor in another memory cell, and the transistor may retain charge in another capacitor (not shown in the figures).

In some embodiments, the conductive layer 12 and the conductive layer 14 may be configured to address different memory cells. In some embodiments, the conductive layer 12 may include a passing wordline and the conductive layer 14 may include an active wordline. As used herein, the term "active wordline" refers to a wordline that is configured to receive a voltage to address a memory cell and the term "passing wordline" refers to a wordline that is configured to receive a voltage to address an adjacent memory cell.

In some embodiments, the conductive layer 12 may be a passing wordline in one memory cell, but becomes an active wordline in another memory cell. In some embodiments, the conductive layer 14 may be an active wordline in the memory cell, but becomes a passing wordline in yet another memory cell.

In some embodiments, the conductive layer 12 and the conductive layer 14 may be configured to receive different voltages. For example, the conductive layer 12 may be configured to receive a negative voltage and the conductive layer 14 may be configured to receive a positive voltage, or vice versa.

In some embodiments, the semiconductor device 1 may further include a bitline 16, insulating layers 17, 18, 20, 22, a capacitor contact plug 19, a capacitor contact pad 21, and a capacitor 23.

In some embodiments, the substrate 10 may include a surface 101 and a surface 102 opposite to the surface 101. In some embodiments, the surface 101 may be an active surface of the substrate 10 and the surface 102 may be a backside surface of the substrate 10.

In some embodiments, the substrate 10 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a layered semiconductor such as silicon/silicon germanium, silicon-on-insulator, or silicon germanium-on-insulator.

In some embodiments, the diffusion region 10a and the diffusion region 10b may be disposed over or in the substrate 10. In some embodiments, the diffusion region 10a and the diffusion region 10b may be disposed over or proximal to the surface 101 of the substrate 10. In some embodiments, the diffusion region 10a and the diffusion region 10b may be disposed on opposite sides of the conductive layer 14.

In some embodiments, the diffusion region 10a and the diffusion region 10b may be doped with an N-type dopant such as phosphorus (P), arsenic (As), or antimony (Sb). In some other embodiments, the diffusion region 10a and the diffusion region 10b may be doped with a P-type dopant such as boron (B) or indium (In).

In some embodiments, the diffusion region 10a and the diffusion region 10b may be doped with dopants or impurity ions having the same conductivity types. In some embodiments, the diffusion region 10a and the diffusion region 10b may be doped with dopants or impurity ions having different conductivity types.

In some embodiments, the dielectric layer 11 may be disposed in the substrate 10. In some embodiments, the dielectric layer 11 may be a part of an isolation structure, such as shallow trench isolation (STI) structures. In some embodiments, the dielectric layer 11 may be disposed in an STI trench of the substrate 10.

In some embodiments, the dielectric layer 11 may include a bi-layered structure. For example, the dielectric layer 11 may include a sublayer 11a and a sublayer 11b. For example, an interface or a boundary between the sublayer 11a and the sublayer 11b may be observed.

In some embodiments, the sublayer 11a may include a dielectric layer, such as an oxidation film. The sublayer 11a may extend from the surface 101 of the substrate 10 into the substrate 10. The sublayer 11a may partially penetrate the substrate 10. In some embodiments, the sublayer 11a may have a surface (such as a top surface) 11a1 substantially coplanar with the surface 101 of the substrate 10.

In some embodiments, the sublayer 11b may include a dielectric layer, such as an oxidation film. The sublayer 11b may extend from the surface 101 of the substrate 10 into the substrate 10. The sublayer 11b may partially penetrate the substrate 10. In some embodiments, the sublayer 11b may have a surface (such as a top surface) 11b1 substantially coplanar with the surface 101 of the substrate 10. In some embodiments, the surface 11b1 of the sublayer 11b may be substantially coplanar with the surface 11a1 of the sublayer 11a.

In some embodiments, the sublayer 11a may be disposed between the sublayer 11b and the substrate 10. In some embodiments, the sublayer 11b may be disposed between the sublayer 11a and the conductive layer 12. In some embodiments, the sublayer 11a may define a recessed portion and the sublayer 11b may be disposed in the recessed portion.

In some embodiments, the sublayer 11a and the sublayer 11b may each include a low-k dielectric material, such as fluorine-doped silicon dioxide (FSG), organosilicate glass (OSG), carbon-doped oxide (CDO), porous silicon dioxide, etc. In some embodiments, the sublayer 11a and the sublayer 11b may each be a dielectric material having a dielectric constant that is lower than that of silicon dioxide ($SiO_2$), or a dielectric material having a dielectric constant lower than about 4.0.

In some embodiments, the sublayer 11a and the sublayer 11b may have different materials. In some embodiments, the sublayer 11a and the sublayer 11b may have the same material formed by different operations. For example, the sublayer 11a may be formed by a chemical vapor deposition (CVD) process and the sublayer 11b may be formed by an atomic layer deposition (ALD) process. For example, the sublayer 11a and the sublayer 11b may be formed in different steps.

In some embodiments, the sublayer 11a and the sublayer 11b may have different densities, such as different particle densities. For example, a density of the sublayer 11a may be lower than a density of the sublayer 11b. A density of the sublayer 11b may be higher than a density of the sublayer 11a. For example, the sublayer 11b may be denser than the sublayer 11a. For example, the surface 11b1 of the sublayer 11b may be denser than the surface 11a1 of the sublayer 11a.

In some embodiments, the conductive layer 12 may be disposed in the substrate 10. In some embodiments, the conductive layer 12 may be disposed in the dielectric layer 11. In some embodiments, the dielectric layer 11 (including the sublayer 11a and the sublayer 11b) may define a recessed portion and the conductive layer 12 may be disposed in the recessed portion. In some embodiments, the conductive layer 12 may be surrounded by the sublayer 11b and further surrounded by the sublayer 11a. In some embodiments, the conductive layer 12 may be separated from the substrate 10 by the sublayer 11b and the sublayer 11a. In some embodiments, the conductive layer 12 may have a surface (such as a top surface) 121 spaced apart from the surface 101 of the substrate 10. For example, the surface 121 of the conductive layer 12 may not be coplanar with the surface 101 of the substrate 10. In some embodiments, the surface 121 of the conductive layer 12 may be spaced apart from the surface 11b1 of the sublayer 11b and the surface 11a1 of the sublayer 11a. For example, the surface 121 of the conductive layer 12 may not be coplanar with the surface 11b1 of the sublayer 11b and the surface 11a1 of the sublayer 11a.

In some embodiments, the conductive layer 12 may include a single layer of metal, metal composite or layers of conductive materials. In some embodiments, the conductive layer 12 may include polycrystalline silicon (poly-Si), titanium nitride (TiN), tungsten nitride (WN), or the like.

In some embodiments, the dielectric layer 13 may be disposed in the substrate 10. In some embodiments, the dielectric layer 13 may include an oxidation film. The dielectric layer 13 may extend from the surface 101 of the substrate 10 into the substrate 10. The dielectric layer 13 may penetrate the substrate 10. In some embodiments, the dielectric layer 13 may have a surface 131 (such as a top surface) substantially coplanar with the surface 101 of the substrate 10.

In some embodiments, the dielectric layer 13 may include a low-k dielectric material, such as fluorine-doped silicon dioxide (FSG), organosilicate glass (OSG), carbon-doped oxide (CDO), porous silicon dioxide, etc. In some embodiments, the dielectric layer 13 may include a dielectric material having a dielectric constant that is lower than that of silicon dioxide ($SiO_2$), or a dielectric material having a dielectric constant lower than about 4.0.

In some embodiments, the dielectric layer 13 may have a material different from that of the sublayer 11a and the sublayer 11b. In some embodiments, the dielectric layer 13, the sublayer 11a, and the sublayer 11b may have the same material formed by different operations. For example, the dielectric layer 13 may be formed by a thermal oxidation operation. In some embodiments, the dielectric layer 13 may be formed after the formation of the sublayer 11a and the formation of the sublayer 11b.

In some embodiments, the dielectric layer 13, the sublayer 11a, and the sublayer 11b may have different densities, such as different particle densities. For example, a density of the dielectric layer 13 may be higher than a density of the sublayer 11a and lower than a density of the sublayer 11b. For example, the dielectric layer 13 (or the surface 131) may be denser than the sublayer 11a (or the surface 11a1). For example, the sublayer 11b (or the surface 11b1) may be denser than the dielectric layer 13 (or the surface 131).

In some embodiments, the conductive layer 14 may be disposed in the substrate 10. In some embodiments, the conductive layer 14 may be disposed in the dielectric layer 13. In some embodiments, the dielectric layer 13 may define a recessed portion and the conductive layer 14 may be disposed in the recessed portion. In some embodiments, the conductive layer 14 may be surrounded by the dielectric layer 13. In some embodiments, the conductive layer 14 may be separated from the substrate 10 by the dielectric layer 13. In some embodiments, the dielectric layer 13 may be disposed between the conductive layer 14 and the substrate 10.

In some embodiments, the conductive layer 14 may have a surface (such as a top surface) 141 spaced apart from the surface 101 of the substrate 10. For example, the surface 141 of the conductive layer 14 may not be coplanar with the surface 101 of the substrate 10. In some embodiments, the surface 141 of the conductive layer 14 may be spaced apart from the surface 131 of the dielectric layer 13. For example, the surface 141 of the conductive layer 14 may not be coplanar with the surface 131 of the dielectric layer 13.

In some embodiments, the conductive layer 14 may include a single layer of metal, metal composite or layers of conductive materials. In some embodiments, the conductive layer 14 may include polycrystalline silicon (poly-Si), titanium nitride (TiN), tungsten nitride (WN), or the like.

In some embodiments, the dielectric layer 11 (including the sublayer 11a and the sublayer 11b) and the dielectric layer 13 may have different thicknesses. For example, the thickness (such as the greatest thickness or the average thickness) of the dielectric layer 11 may be greater than the thickness (such as the greatest thickness or the average thickness) of the dielectric layer 13. For example, the distance between the conductive layer 12 and the substrate 10 may be greater than the distance between the conductive layer 14 and the substrate 10.

In some embodiments, a dielectric constant of the dielectric layer 11 (including the sublayer 11a and the sublayer 11b) may be lower than a dielectric constant of the substrate 10. In some embodiments, a dielectric constant of the dielectric layer 13 may be lower than a dielectric constant of the substrate 10.

In some embodiments, the low-k characteristic of the dielectric layer 11 and the dielectric layer 13 may help isolation between the conductive layer 12 and the conductive layer 14. For example, the low-k characteristic of the dielectric layer 11 and the dielectric layer 13 may help reduce the effective electric field induced when the conductive layer 12 (e.g., the passing wordline) is turned on or activated and prevent interference therebetween.

In some embodiments, the insulating layer 15 may be disposed on the surface 121 of the conductive layer 12 and the surface 141 of the conductive layer 14. In some embodiments, a part of the insulating layer 15 over the conductive layer 12 may be separated from the substrate 10 by the dielectric layer 11 (including the sublayer 11a and the sublayer 11b). In some embodiments, a part of the insulating layer 15 over the conductive layer 12 may cover the surface 11a1 of the sublayer 11a and the surface 11b1 of the sublayer 11b. In some embodiments, a part of the insulating layer 15 over the conductive layer 12 may be in contact with the surface 11a1 of the sublayer 11a and the surface 11b1 of the sublayer 11b.

In some embodiments, a part of the insulating layer 15 over the conductive layer 14 may be separated from the substrate 10 by the dielectric layer 13. In some embodiments, a part of the insulating layer 15 over the conductive layer 14 may cover the surface 131 of the dielectric layer 13. In some embodiments, a part of the insulating layer 15 over the conductive layer 14 may be in contact with the surface 131 of the dielectric layer 13.

In some embodiments, at least a part of the insulating layer 15 may be buried in the substrate 10. For example, at least a part of the insulating layer 15 may be buried in the recessed portion defined by the sublayer 11b and the surface 121 of the conductive layer 12. For example, at least a part of the insulating layer 15 may be buried in the recessed portion defined by the dielectric layer 13 and the surface 141 of the conductive layer 14.

In some embodiments, the insulating layer 15 may include, but is not limited to, silicon oxide ($SiO_2$), silicon nitride ($Si_3N_4$), silicon oxynitride ($N_2OSi_2$), silicon nitride oxide ($N_2OSi_2$), etc. In some embodiments, the insulating layer 15 may cover and protect the surface 121 of the conductive layer 12 and the surface 141 of the conductive layer 14.

In some embodiments, the bitline 16 may be disposed over the diffusion region 10b. In some embodiments, the bitline 16 may be electrically connected with the diffusion region 10b. In some embodiments, the bitline 16 may include, but is not limited to, a polysilicon (poly-Si) 16a and a lamination 16b including a tungsten nitride ($WN_x$) film, a tungsten (W) film, etc.

In some embodiments, the insulating layer 17 may be disposed on the insulating layer 15 and the bitline 16. In some embodiments, the insulating layer 17 may include, but is not limited to, silicon oxide ($SiO_2$), silicon nitride ($Si_3N_4$), silicon oxynitride ($N_2OSi_2$), silicon nitride oxide ($N_2OSi_2$), etc.

In some embodiments, the insulating layer 18 may be disposed on the insulating layer 17. In some embodiments, a top surface of the insulating layer 18 may be substantially coplanar with a top surface of the capacitor contact plug 19. In some embodiments, the insulating layer 18 may include, but is not limited to, silicon oxide ($SiO_2$), silicon nitride ($Si_3N_4$), silicon oxynitride ($N_2OSi_2$), silicon nitride oxide ($N_2OSi_2$), etc.

In some embodiments, the capacitor contact plug 19 may penetrate or extend through the insulating layer 17 and the insulating layer 18. In some embodiments, the capacitor contact plug 19 may be disposed on the diffusion region 10a. In some embodiments, the capacitor contact plug 19 may be electrically connected with the diffusion region 10a.

In some embodiments, the capacitor contact plug 19 may include a suitable conductive material. For example, the capacitor contact plug 19 may include tungsten (W), copper (Cu), aluminum (Al), silver (Ag), an alloy thereof, or a combination thereof.

In some embodiments, the insulating layer 20 may be disposed on the insulating layer 18 and the capacitor contact plug 19. In some embodiments, the insulating layer 22 may be disposed on the insulating layer 20. In some embodiments, the insulating layer 20 may surround the capacitor contact pad 21. In some embodiments, the insulating layer 22 and the insulating layer 20 may surround the capacitor 23. In some embodiments, the insulating layer 20 and the insulating layer 22 may each include, but are not limited to, silicon oxide (SiO$_2$), silicon nitride (Si$_3$N$_4$), silicon oxynitride (N$_2$OSi$_2$), silicon nitride oxide (N$_2$OSi$_2$), etc.

In some embodiments, the capacitor 23 may be electrically connected with the diffusion region 10a (e.g., a source junction or a drain junction of a corresponding transistor) through the capacitor contact plug 19. In some embodiments, the capacitor 23 may include a bottom electrode 23a, an insulating layer 23b, and a top electrode 23c.

In some embodiments, the bottom electrode 23a and the top electrode 23c may include doped polysilicon (poly-Si) or metal. In some embodiments, the insulating layer 23b may include tantalum pentoxide (Ta$_2$O$_5$), aluminum oxide (Al$_2$O$_3$), strontium bismuth tantalum oxide (SrBi$_2$Ta$_2$O$_9$, SBT), barium strontium titanate oxide (BaSrTiO$_3$, BST), a dielectric material having a dielectric constant that is higher than that of silicon dioxide (SiO$_2$), or a dielectric material having a dielectric constant of about 4.0 or greater.

In a comparative embodiment, the sublayer 11b may be omitted, and the conductive layer 12 may be separated from the substrate 10 only by the sublayer 11a.

As the DRAM device becomes more highly integrated, it becomes more difficult to isolate an active wordline (such as the conductive layer 14) in a memory cell from a passing wordline (such as the conductive layer 12) in an adjacent memory cell. For example, when a passing wordline (such as the conductive layer 12) is turn on, an inversion layer may be created and may extend the source/drain junction, creating an internal electric field. Junction leakage current may be accelerated by trap-assisted tunneling generated by the internal electric field.

By forming two dielectric layers (i.e., the sublayer 11a and the sublayer 11b) between the conductive layer 12 and the substrate 10, the low-k dielectric material between the conductive layer 12 and the substrate 10 is thicker; the internal electric field may be reduced, and hence the junction leakage current may be lowered. Therefore, interference between wordlines (such as the conductive layer 12 and the conductive layer 14) in different memory cells of the present disclosure can be avoided and charge written to the cell capacitor can be retained. In some embodiments, the sublayer 11b having a higher density than the sublayer 11a may further enhance the isolation between wordlines (such as the conductive layer 12 and the conductive layer 14) in different memory cells of the present disclosure.

FIGS. 2A, 2B, 2C, 2D, 2E, 2F, 2G, 2H, 2I, 2J, 2K, 2L, 2M, 2N, 2O, 2P, 2Q, 2R, 2S, and 2T illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1 may be manufactured by the operations described below with respect to FIGS. 2A, 2B, 2C, 2D, 2E, 2F, 2G, 2H, 2I, 2J, 2K, 2L, 2M, 2N, 2O, 2P, 2Q, 2R, 2S, and 2T.

Figure 2A:
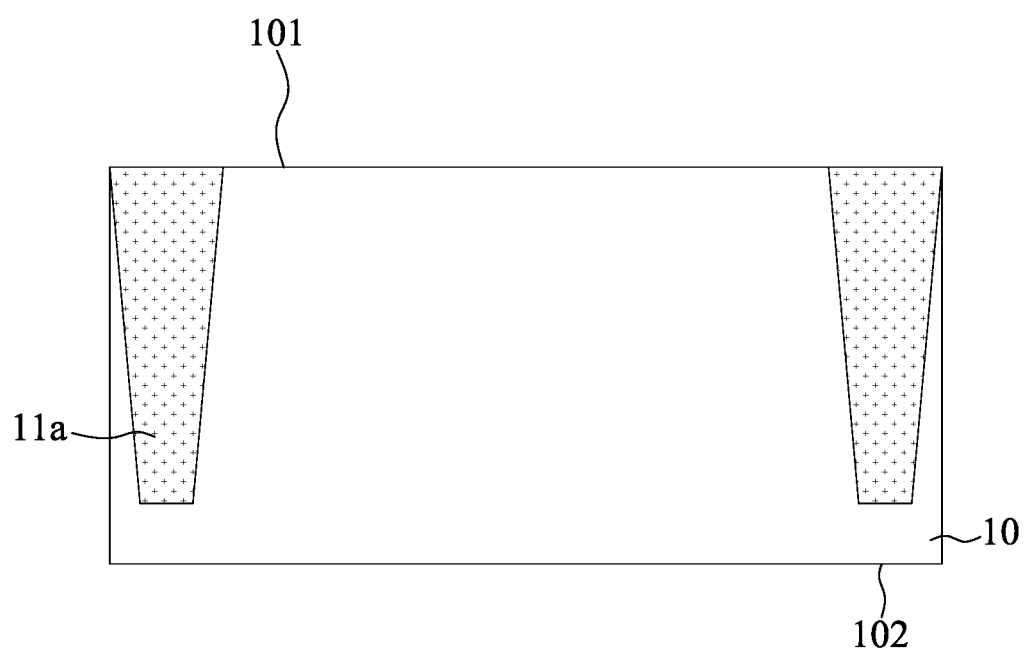
FIG. 2A illustrates one or more stages of a method of manufacturing a semiconductor device in accordance with some embodiments of the present disclosure.

Referring to FIG. 2A, the substrate 10 may be provided. The sublayer 11a may be disposed in the substrate 10. In some embodiments, the sublayer 11a may be formed by trench etching followed by filling the trench with a dielectric material. In some embodiments, the sublayer 11a may be formed by a chemical vapor deposition (CVD) process. In some embodiments, the sublayer 11a may include a low-k dielectric material, such as fluorine-doped silicon dioxide (FSG), organosilicate glass (OSG), carbon-doped oxide (CDO), porous silicon dioxide, etc. In some embodiments, the sublayer 11a may be a dielectric material having a dielectric constant that is lower than that of silicon dioxide (SiO$_2$), or a dielectric material having a dielectric constant lower than about 4.0.

Figure 2B:
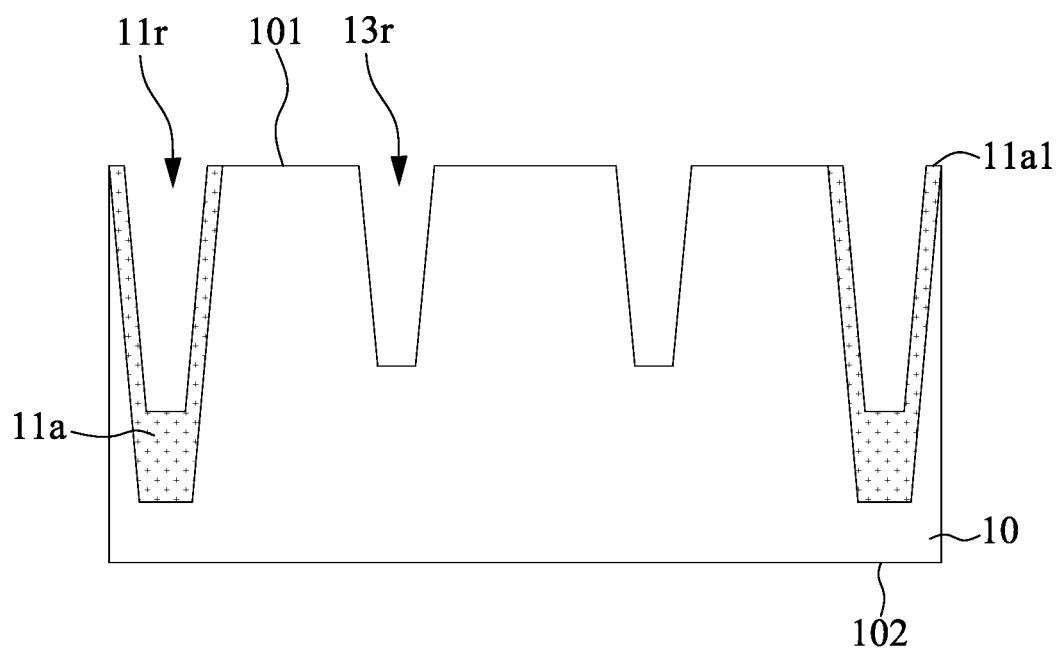
FIG. 2B illustrates one or more stages of a method of manufacturing a semiconductor device in accordance with some embodiments of the present disclosure.

Referring to FIG. 2B, a recessed portion 11r may be formed in the sublayer 11a and a recessed portion 13r may be formed in the substrate 10. In some embodiments, the recessed portion 11r and the recessed portion 13r may be spaced apart from each other. In some embodiments, the recessed portion 11r and the recessed portion 13r may be formed sequentially or concurrently.

In some embodiments, the recessed portion 11r and the recessed portion 13r may be formed by lithography and etching techniques. In some embodiments, the sublayer 11a and the substrate 10 have different etch rates with respect to an etchant. For example, the etch rate of the sublayer 11a may be greater than the etch rate of the substrate 10 with respect to an etchant. In some embodiments, a depth of the recessed portion 11r may be deeper than a depth of the recessed portion 13r.

Figure 2C:
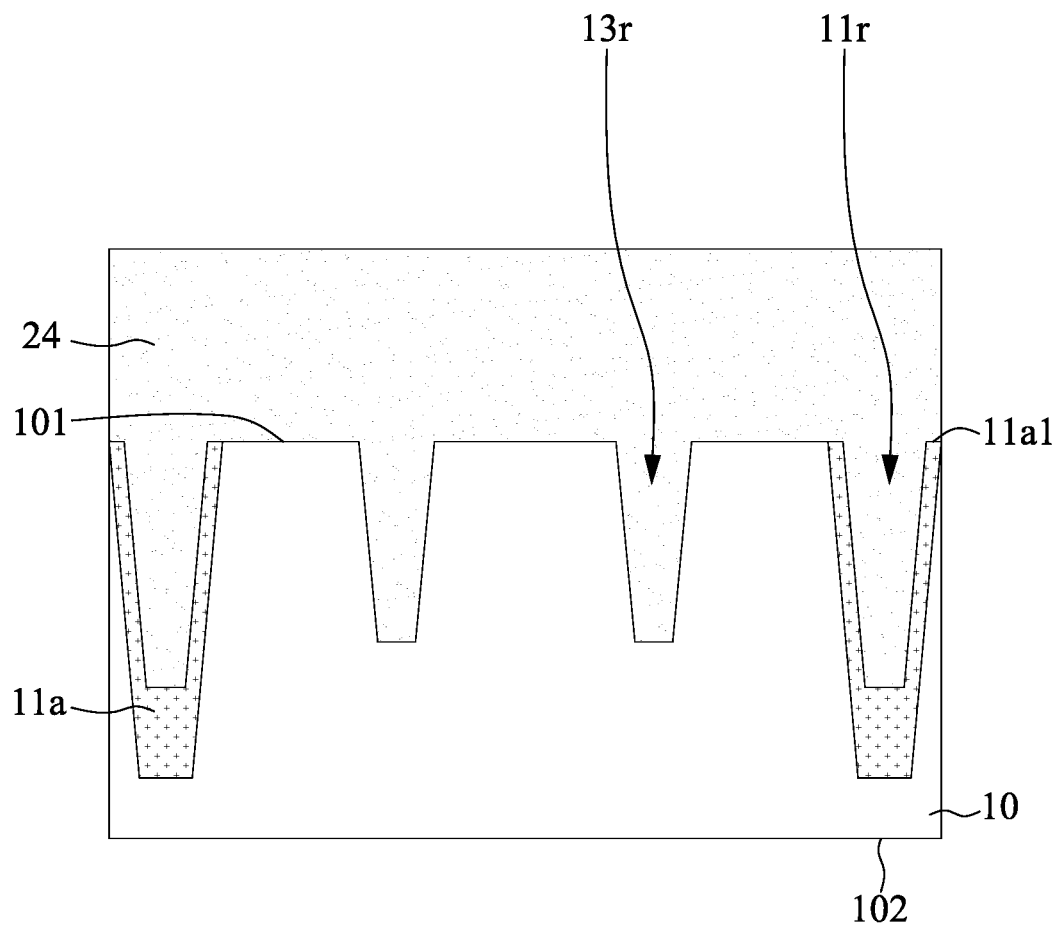
FIG. 2C illustrates one or more stages of a method of manufacturing a semiconductor device in accordance with some embodiments of the present disclosure.

Referring to FIG. 2C, a protection layer 24 may be disposed on the surface 101 of the substrate 10. The protection layer 24 may be disposed in the recessed portion 11r and the recessed portion 13r. The protection layer 24 may fill up the recessed portion 11r and the recessed portion 13r. In some embodiments, the protection layer 24 and the substrate 10 have different etch rates with respect to an etchant. In some embodiments, the protection layer 24 may exhibit an etching property different from that of the substrate 10. For example, the protection layer 24 may include nitride or photoresist.

Figure 2D:
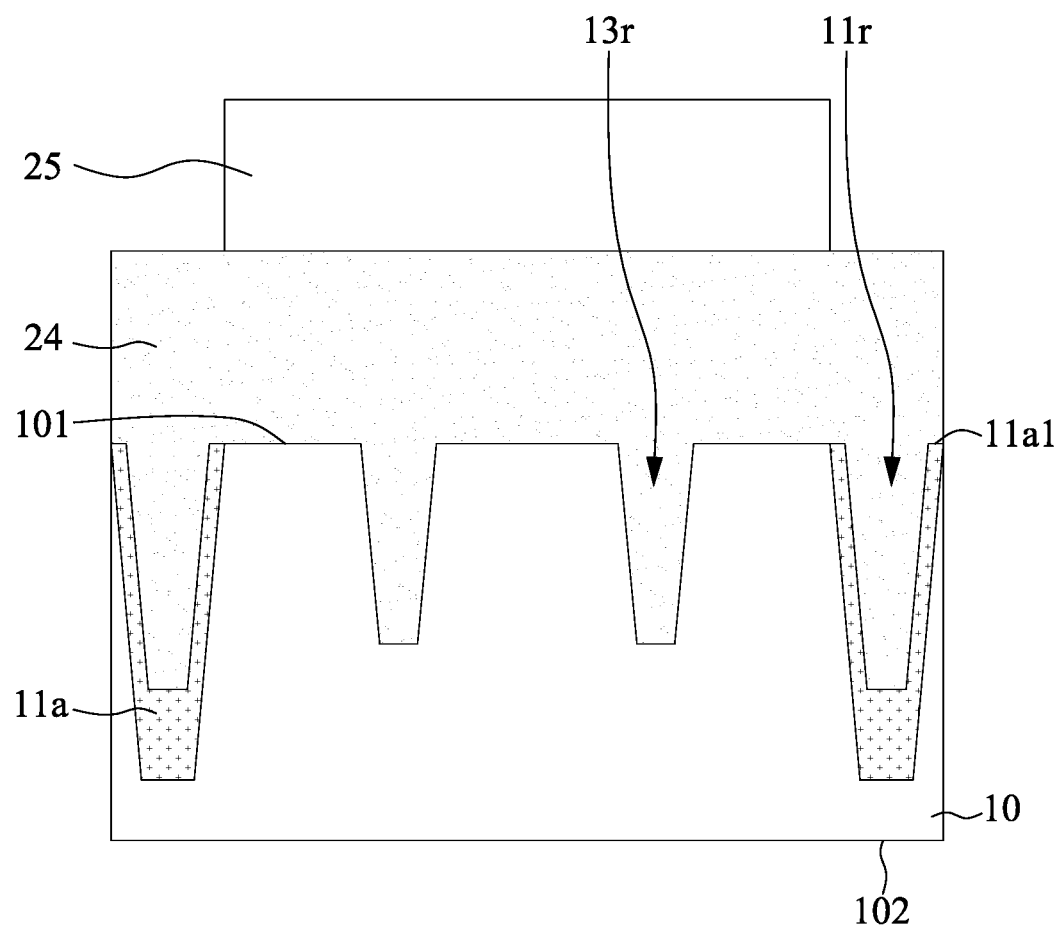
FIG. 2D illustrates one or more stages of a method of manufacturing a semiconductor device in accordance with some embodiments of the present disclosure.

Referring to FIG. 2D, a photoresist 25 and a hard mask (not illustrated in the figures) may be provided on the protection layer 24. In some embodiments, the photoresist 25 may be patterned. In some embodiments, the photoresist 25 may be disposed over the recessed portion 13r. In some embodiments, the photoresist 25 may be overlapped with the recessed portion 13r. In some embodiments, the photoresist 25 may not cover the recessed portion 11r. In some embodiments, the photoresist 25 may not be overlapped with the recessed portion 11r.

Figure 2E:
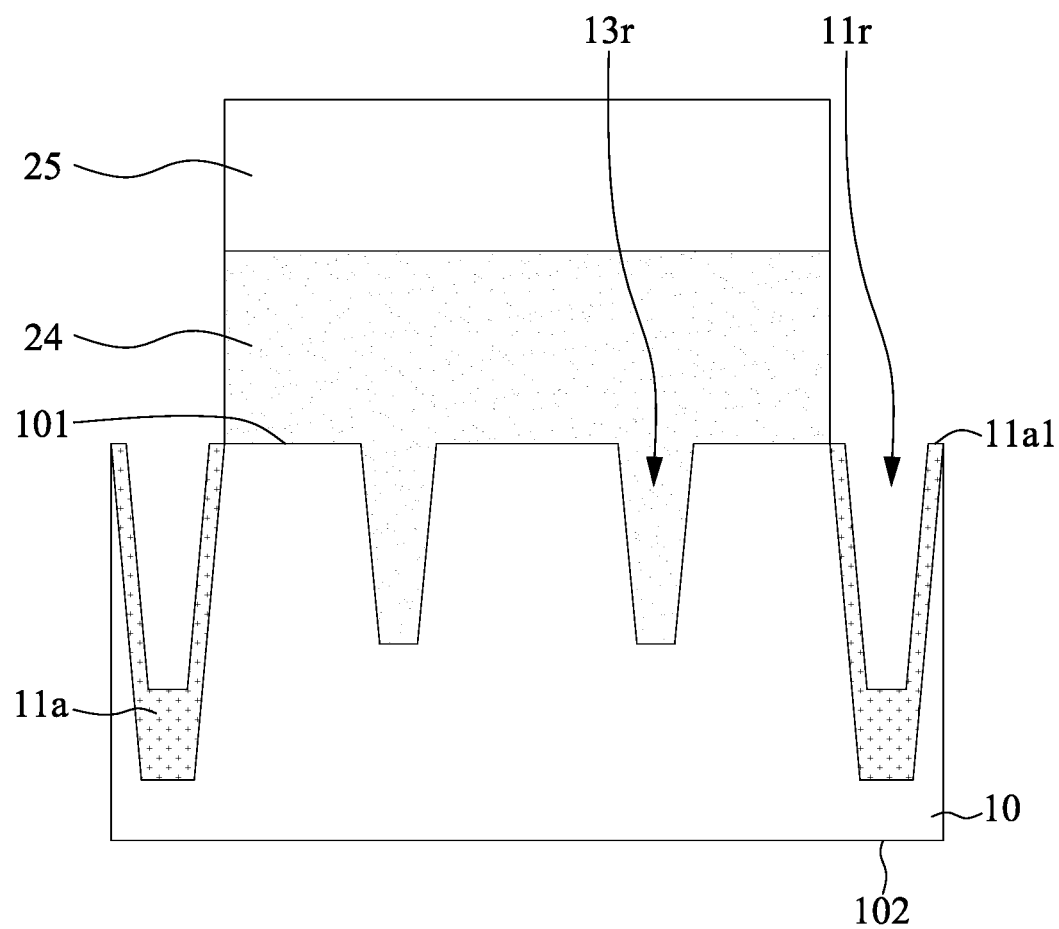
FIG. 2E illustrates one or more stages of a method of manufacturing a semiconductor device in accordance with some embodiments of the present disclosure.

Referring to FIG. 2E, the protection layer 24 may be patterned. In some embodiments, since the protection layer 24 and the substrate 10 have different etch rates or exhibit different etching properties with respect to an etchant, the substrate 10 may remain unchanged when the protection layer 24 is patterned. After removing a part of the protection layer 24, the sublayer 11a may be exposed and the surface 11a1 may be exposed.

Figure 2F:
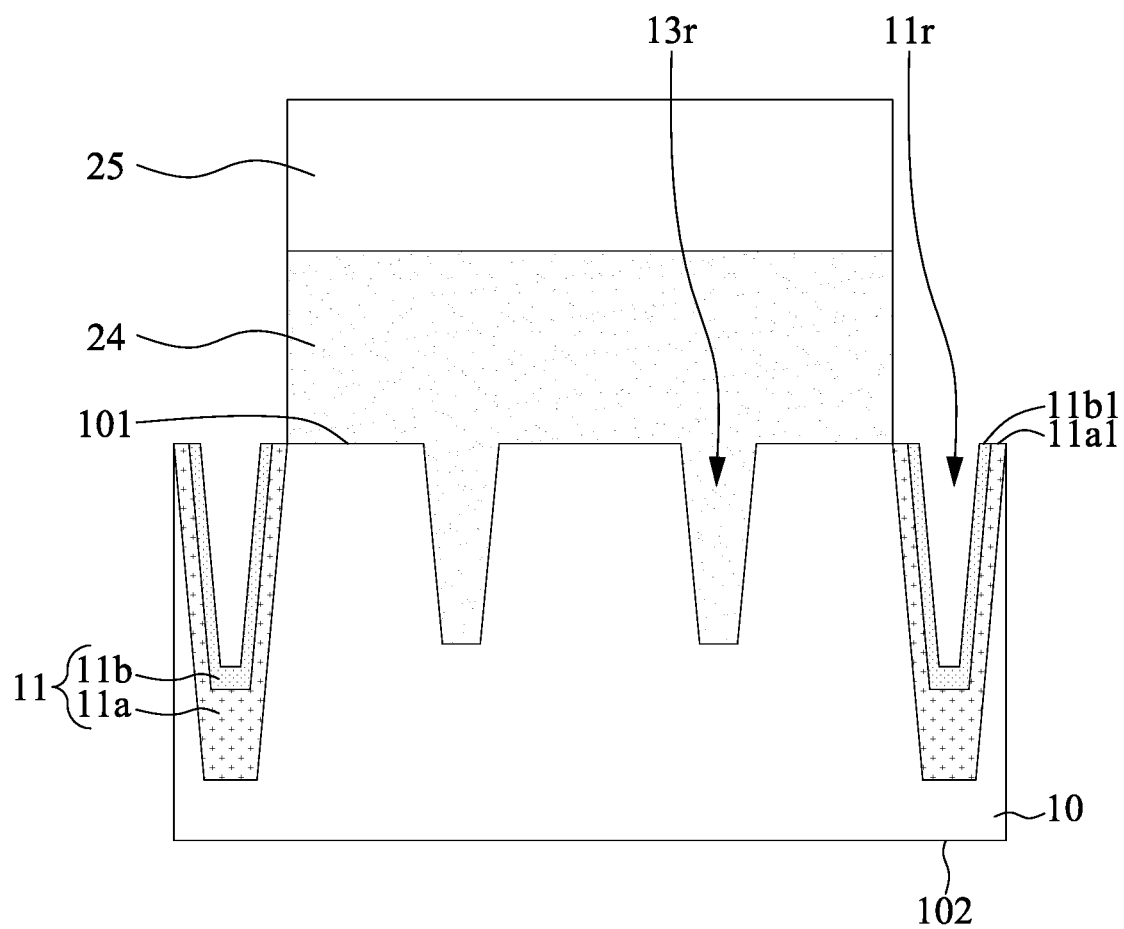
FIG. 2F illustrates one or more stages of a method of manufacturing a semiconductor device in accordance with some embodiments of the present disclosure.

Referring to FIG. 2F, the sublayer 11b may be disposed in the recessed portion 11r and on the sublayer 11a. In some embodiments, the sublayer 11b may be formed by a process different from that of the sublayer 11a. In some embodiments, the sublayer 11b may be formed by an atomic layer deposition (ALD) process. In some embodiments, a density of the sublayer 11b may be higher than a density of the sublayer 11a. In some embodiments, the sublayer 11b may include a low-k dielectric material, such as fluorine-doped silicon dioxide (FSG), organosilicate glass (OSG), carbon-doped oxide (CDO), porous silicon dioxide, etc. In some embodiments, the sublayer 11b may be a dielectric material having a dielectric constant that is lower than that of silicon dioxide (SiO$_2$), or a dielectric material having a dielectric constant lower than about 4.0. In some embodiments, the sublayer 11b and the sublayer 11a may have the same material.

Figure 2G:
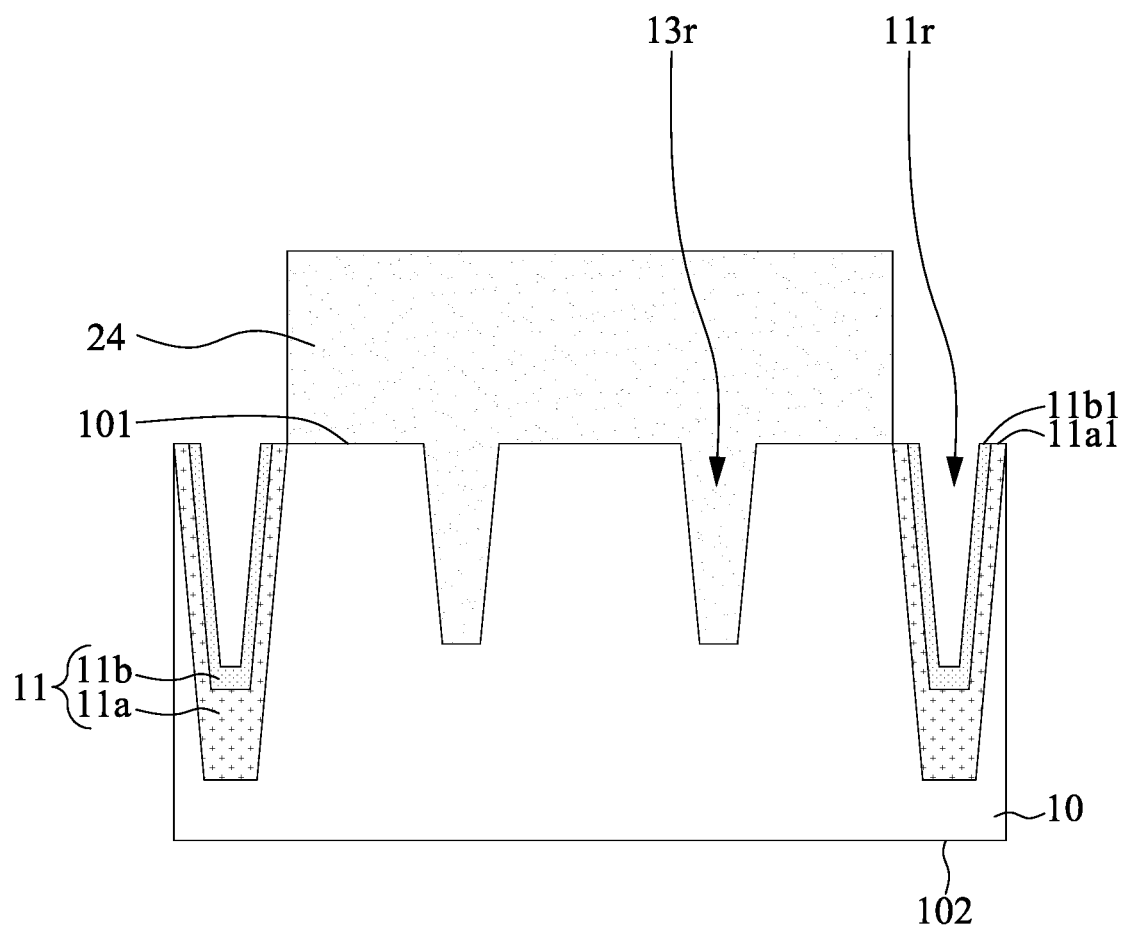
FIG. 2G illustrates one or more stages of a method of manufacturing a semiconductor device in accordance with some embodiments of the present disclosure.

Referring to FIG. 2G, the photoresist 25 may be removed from the protection layer 24.

Figure 2H:
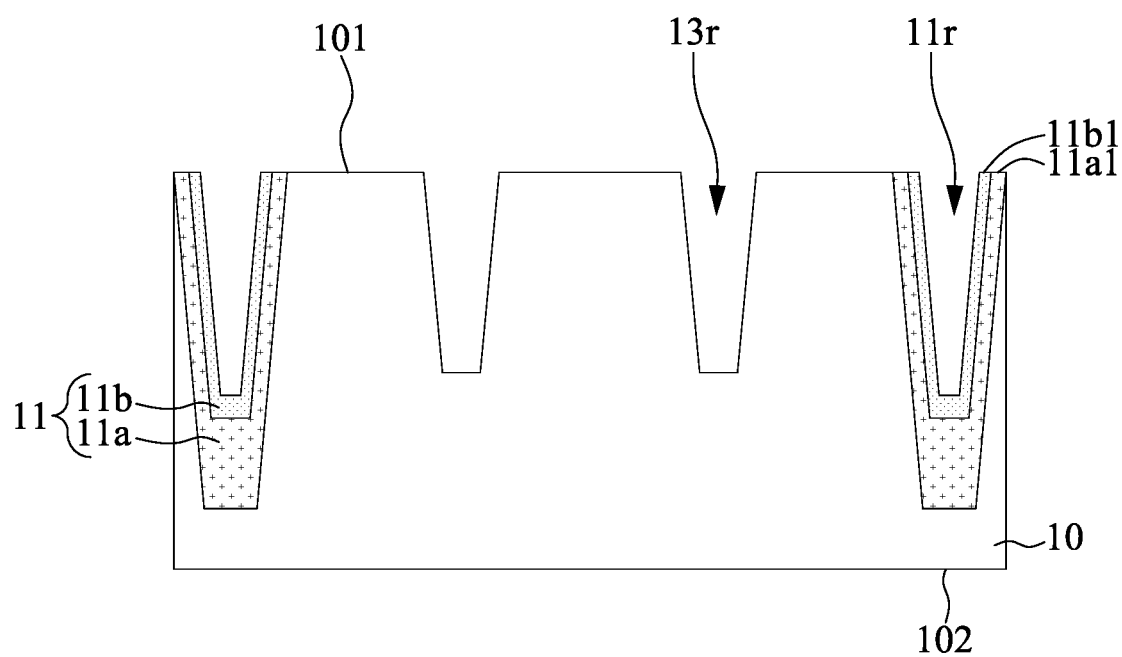
FIG. 2H illustrates one or more stages of a method of manufacturing a semiconductor device in accordance with some embodiments of the present disclosure.

Referring to FIG. 2H, the protection layer 24 may be removed from the substrate 10 by, for example, a wet etching process or other suitable process. After removing the protection layer 24, the recessed portion 13r may be exposed. In other words, the recessed portion 13r may be exposed after the sublayer 11b is disposed in the recessed portion 11r and on the sublayer 11a.

Figure 2I:
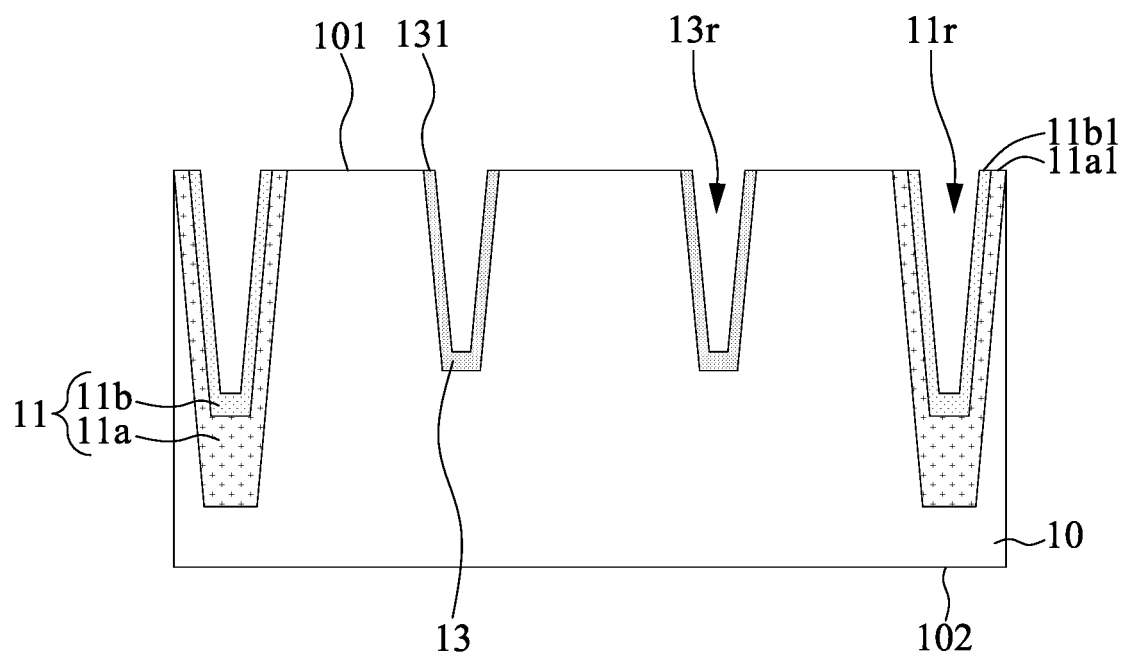
FIG. 2I illustrates one or more stages of a method of manufacturing a semiconductor device in accordance with some embodiments of the present disclosure.

Referring to FIG. 2I, the dielectric layer 13 may be disposed in the recessed portion 13r. In some embodiments, the dielectric layer 13 may be formed by a process different from that of the sublayer 11a or that of the sublayer 11b. In some embodiments, the dielectric layer 13 may be formed by a thermal oxidation operation. In some embodiments, the density of the dielectric layer 13 may be higher than the density of the sublayer 11a and lower than the density of the sublayer 11b. In some embodiments, the dielectric layer 13 may include a low-k dielectric material, such as fluorine-doped silicon dioxide (FSG), organosilicate glass (OSG), carbon-doped oxide (CDO), porous silicon dioxide, etc. In some embodiments, the dielectric layer 13 may be a dielectric material having a dielectric constant that is lower than that of silicon dioxide ($SiO_2$), or a dielectric material having a dielectric constant lower than about 4.0. In some embodiments, dielectric layer 13, the sublayer 11b, and the sublayer 11a may have the same material.

In some embodiments, the surface 11a1 of the sublayer 11a, the surface 11b1 of the sublayer 11b, and/or the surface 131 of the dielectric layer 13 may be formed after a chemical mechanical polishing (CMP) process. In some embodiments, the surface 101 of the substrate 10, the surface 11a1 of the sublayer 11a, the surface 11b1 of the sublayer 11b, and/or the surface 131 of the dielectric layer 13 may be substantially coplanar.

Figure 2J:
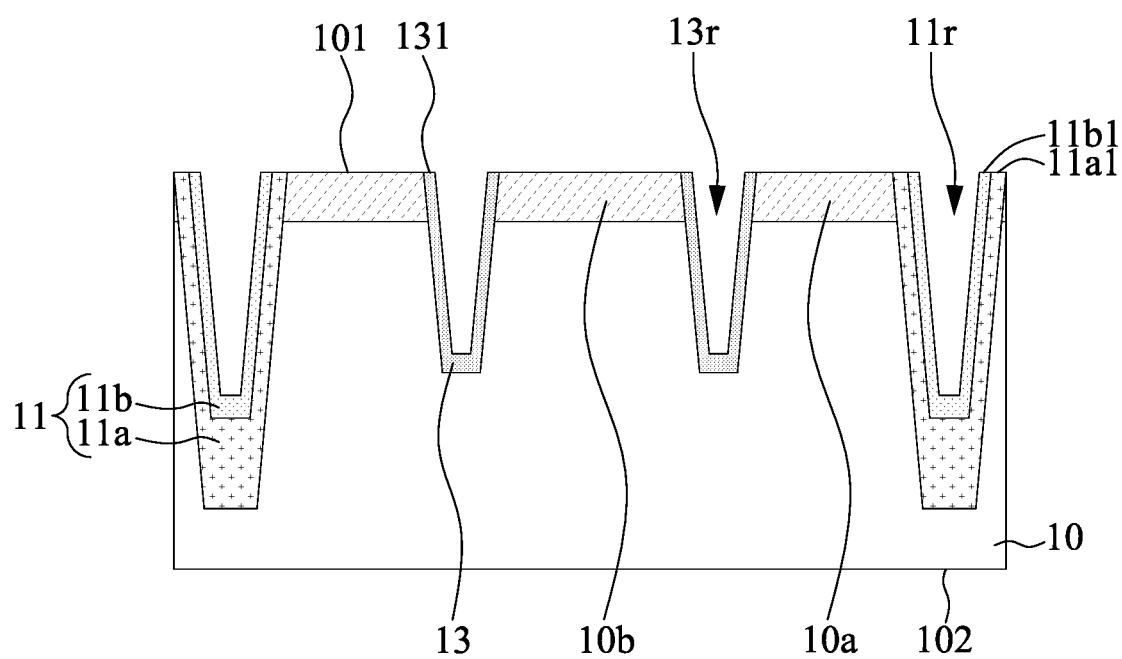
FIG. 2J illustrates one or more stages of a method of manufacturing a semiconductor device in accordance with some embodiments of the present disclosure.

Referring to FIG. 2J, the diffusion regions 10a and 10b may be formed by doping impurities through ion-implantation or thermal diffusion. In some embodiments, the diffusion regions 10a and 10b may be formed over or proximal to the surface 101 of the substrate 10. In some embodiments, the diffusion regions 10a and 10b may be formed subsequent to other operations described. For example, the diffusion regions 10a and 10b may be formed subsequent to one of the operations in FIGS. 2A, 2B, 2C, 2D, 2E, 2F, 2G, 2H.

Figure 2K:
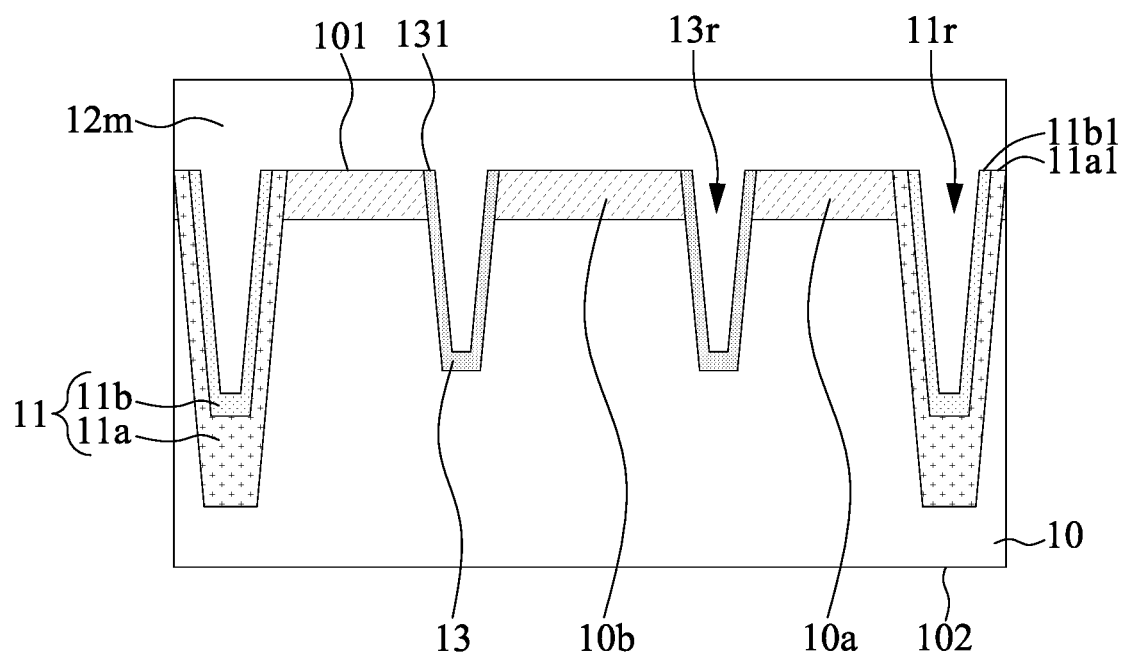
FIG. 2K illustrates one or more stages of a method of manufacturing a semiconductor device in accordance with some embodiments of the present disclosure.

Referring to FIG. 2K, a conductive material 12m may be disposed on the substrate 10 to fill the recessed portion 11r and the recessed portion 13r. In some embodiments, the conductive material 12m may formed by, for example, plating, electroless plating, printing, CVD, or other suitable operations.

Figure 2L:
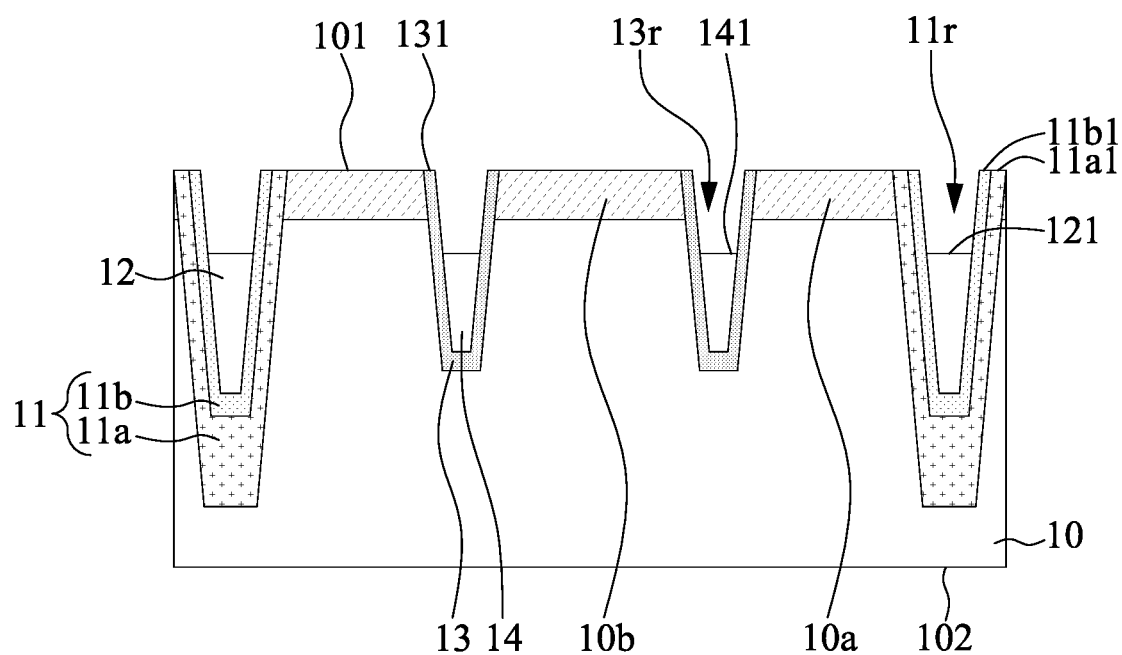
FIG. 2L illustrates one or more stages of a method of manufacturing a semiconductor device in accordance with some embodiments of the present disclosure.

Referring to FIG. 2L, a part of the conductive material 12m may be removed by an etching back process such as a dry etching process using a silicon nitride film (not illustrated in the figures) as a mask. In some embodiments, after the etching back process, the conductive layer 12 may be formed in the recessed portion 11r and the conductive layer 14 may be formed in the recessed portion 13r. In some embodiments, after the etching back process, the surface 121 of the conductive layer 12 may be spaced apart from the surface 101 of the substrate 10. In some embodiments, after the etching back process, the surface 141 of the conductive layer 14 may be spaced apart from the surface 101 of the substrate 10.

Figure 2M:
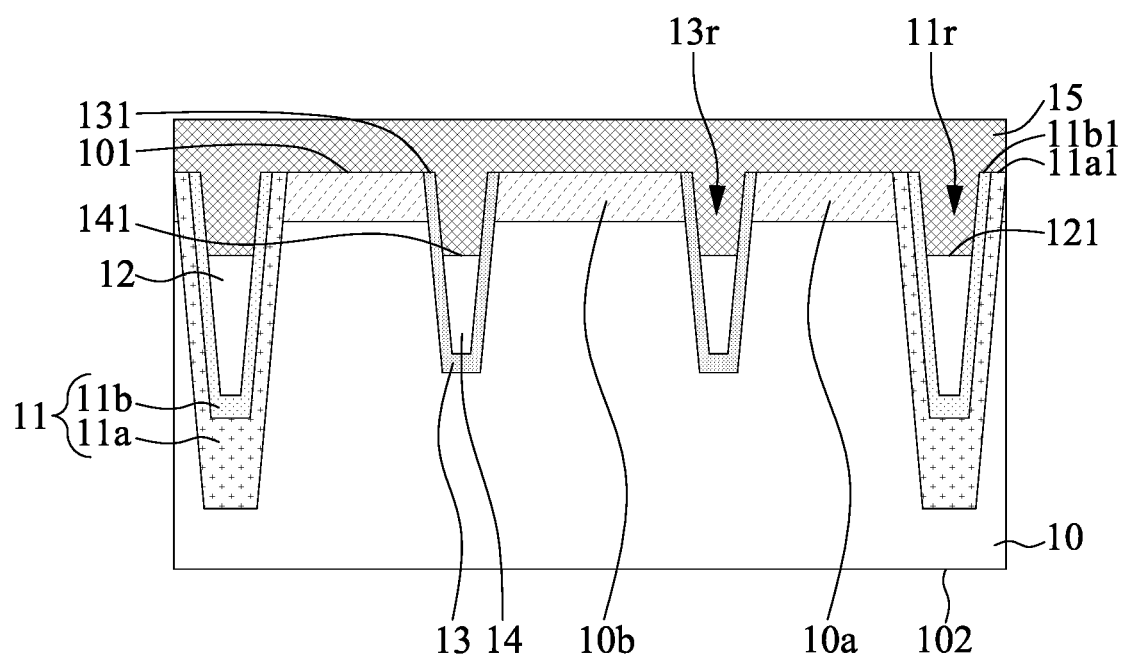
FIG. 2M illustrates one or more stages of a method of manufacturing a semiconductor device in accordance with some embodiments of the present disclosure.

Referring to FIG. 2M, the insulating layer 15 may be disposed on the surface 121 of the conductive layer 12 and the surface 141 of the conductive layer 14. In some embodiments, the insulating layer 15 may be formed by, for example, ALD, CVD, physical vapor deposition (PVD), remote plasma CVD (RPCVD), plasma enhanced CVD (PECVD), coating, etc.

Figure 2N:
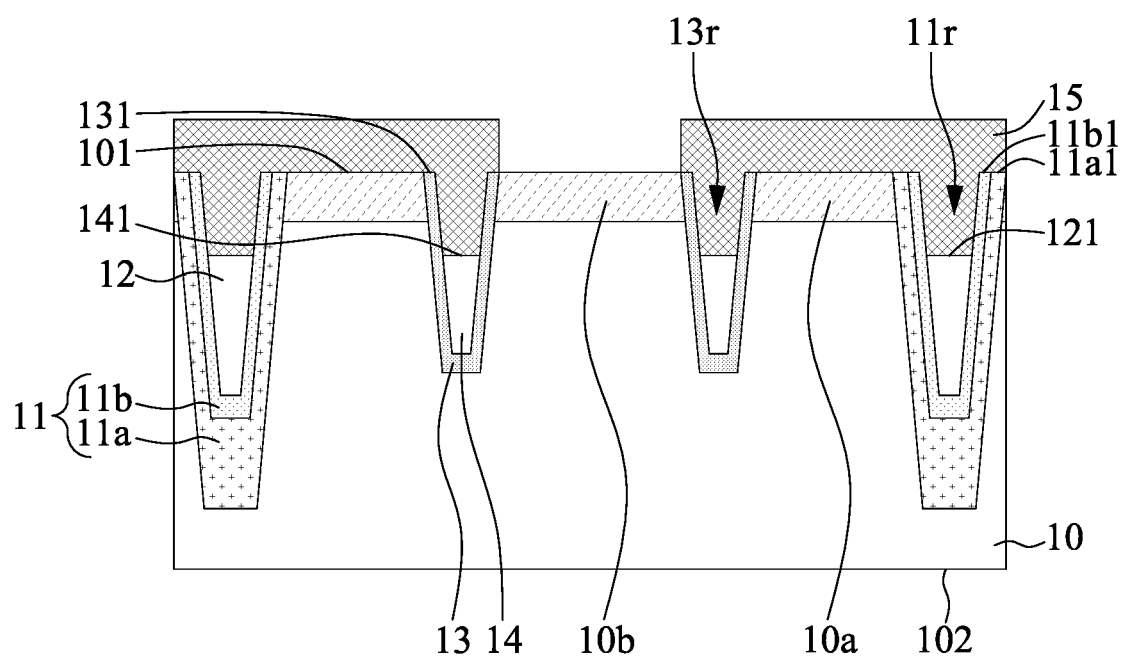
FIG. 2N illustrates one or more stages of a method of manufacturing a semiconductor device in accordance with some embodiments of the present disclosure.

Referring to FIG. 2N, the insulating layer 15 may be patterned to define the location of the bitline formed in the subsequent operations.

Figure 2O:
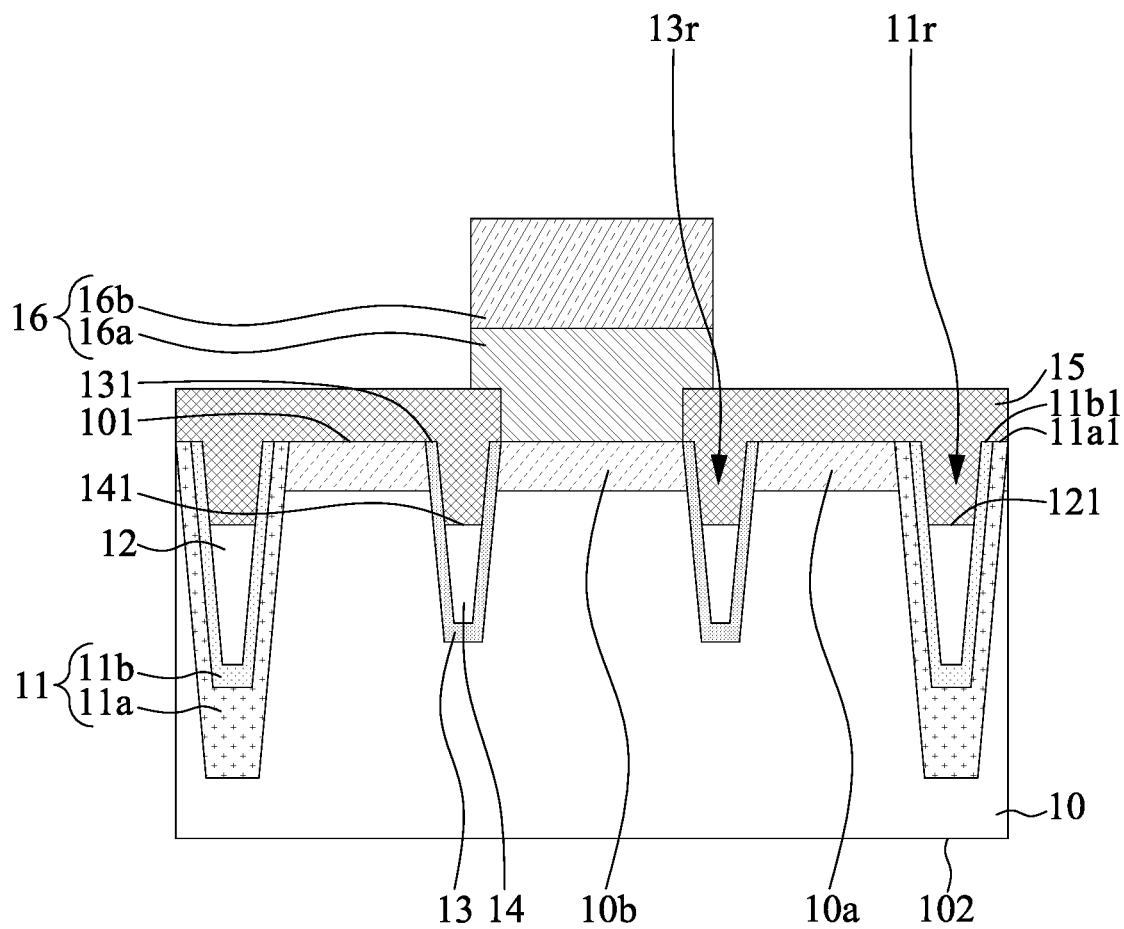
FIG. 2O illustrates one or more stages of a method of manufacturing a semiconductor device in accordance with some embodiments of the present disclosure.

Referring to FIG. 2O, the bitline 16 may be disposed over the diffusion region 10b. For example, a lamination 16b of the W/WN film and the polysilicon 16a may be patterned, thereby forming the bitline 16. In some embodiments, the bitline 16 may be in contact with the diffusion region 10b. In some embodiments, the bitline 16 may be electrically connected with the diffusion region 10b.

Figure 2P:
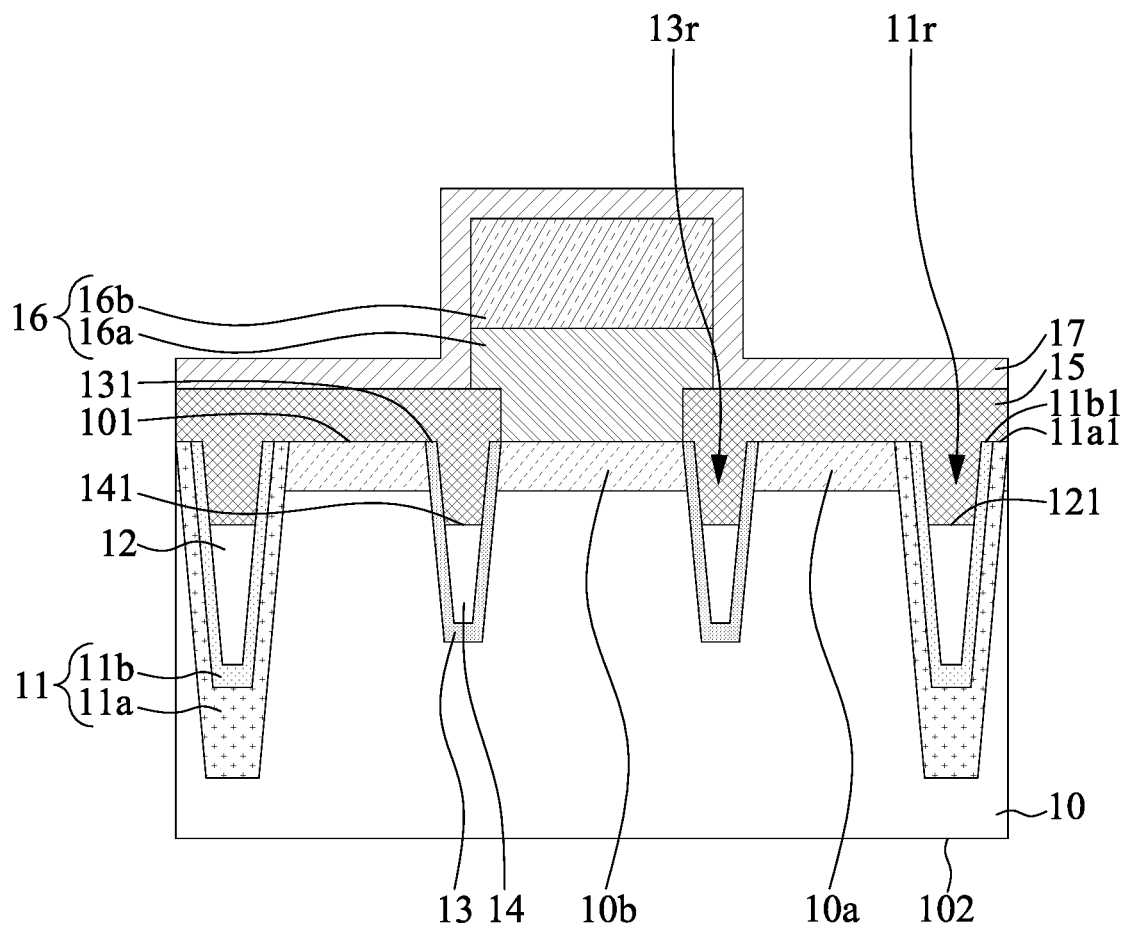
FIG. 2P illustrates one or more stages of a method of manufacturing a semiconductor device in accordance with some embodiments of the present disclosure.

Referring to FIG. 2P, the insulating layer 17 may be disposed on the insulating layer 15 and the bitline 16. In some embodiments, the insulating layer 17 may be formed by, for example, ALD, CVD, PVD, RPCVD, PECVD, coating, etc.

Figure 2Q:
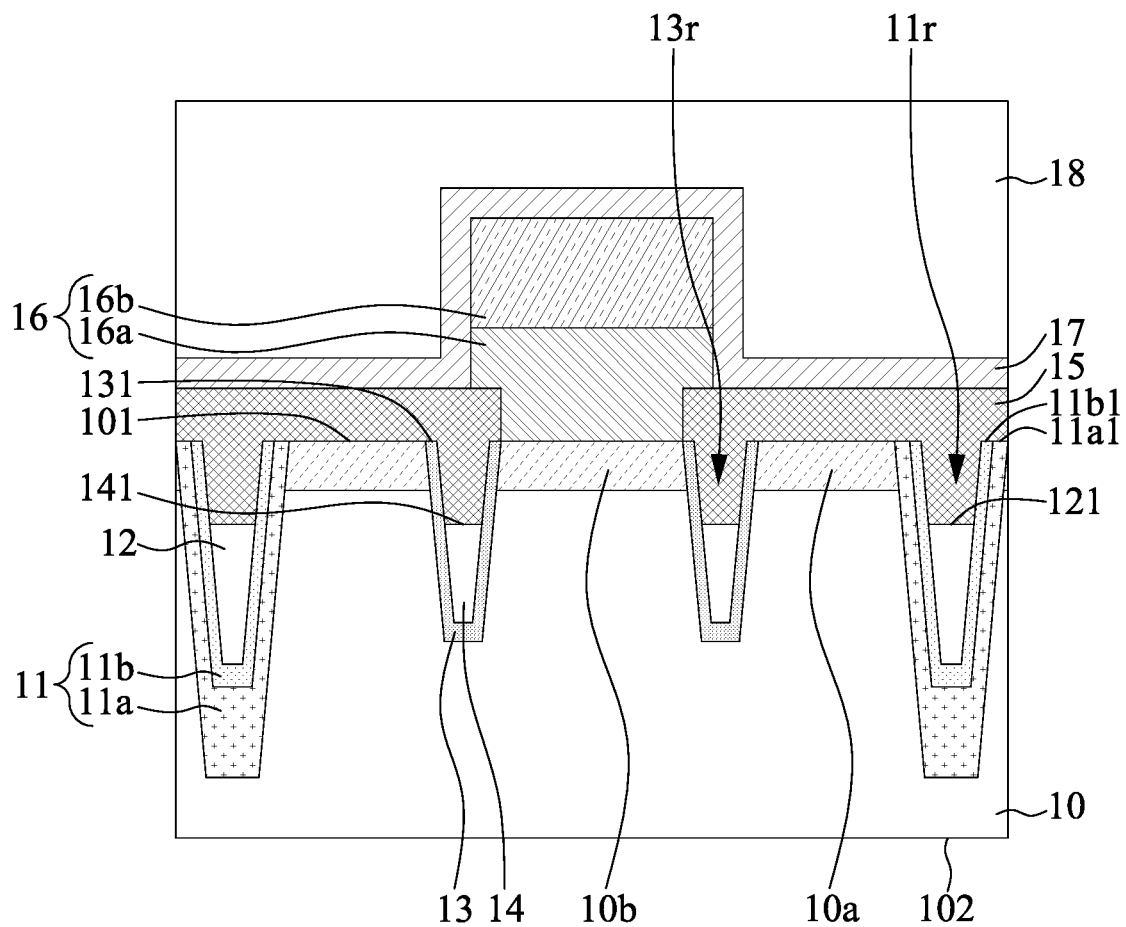
FIG. 2Q illustrates one or more stages of a method of manufacturing a semiconductor device in accordance with some embodiments of the present disclosure.

Referring to FIG. 2Q, the insulating layer 18 may be disposed on the insulating layer 17. In some embodiments, the insulating layer 18 may be formed by, for example, ALD, CVD, PVD, RPCVD, PECVD, coating, etc.

Figure 2R:
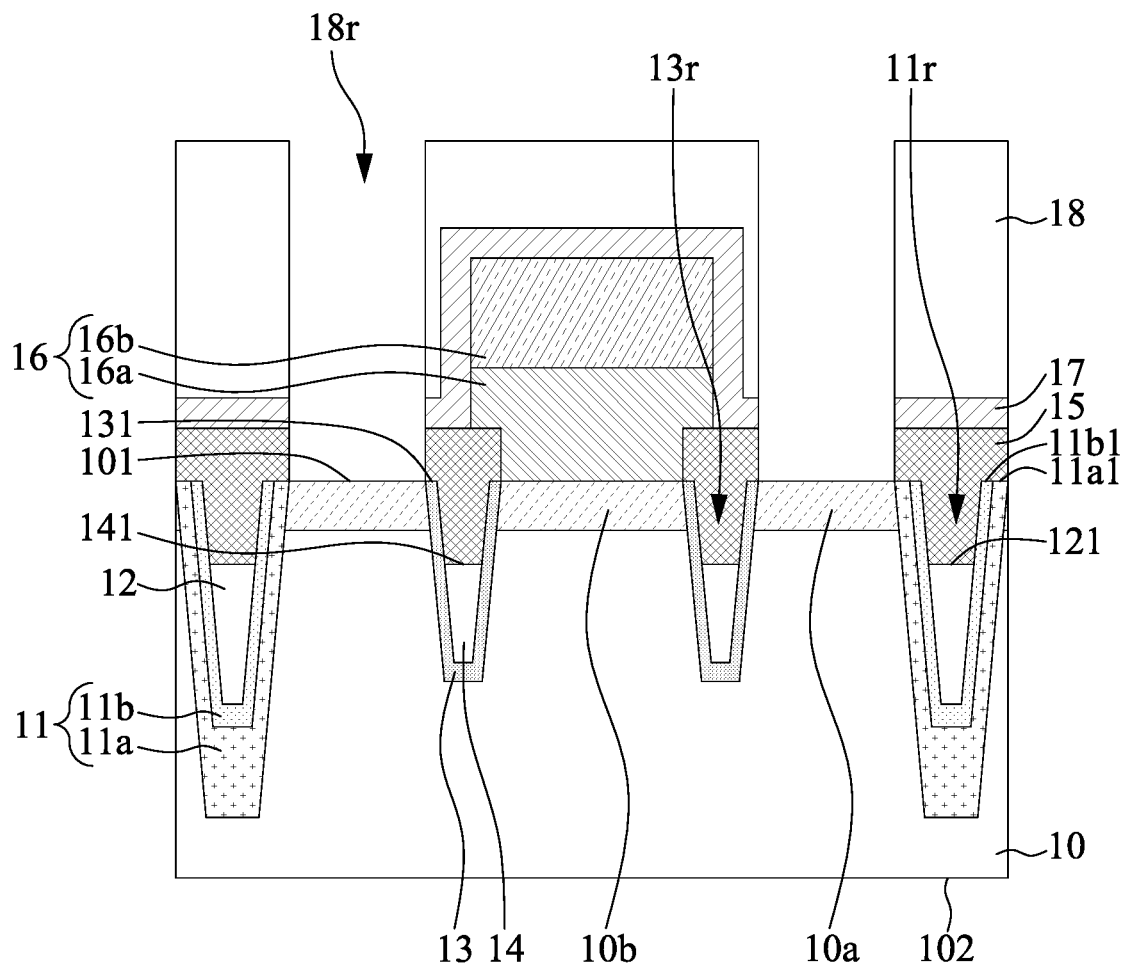
FIG. 2R illustrates one or more stages of a method of manufacturing a semiconductor device in accordance with some embodiments of the present disclosure.

Referring to FIG. 2R, an opening 18r may be formed in the insulating layer 17 and the insulating layer 18 by lithography and etching techniques. The diffusion region 10a may be exposed through the opening 18r.

Figure 2S:
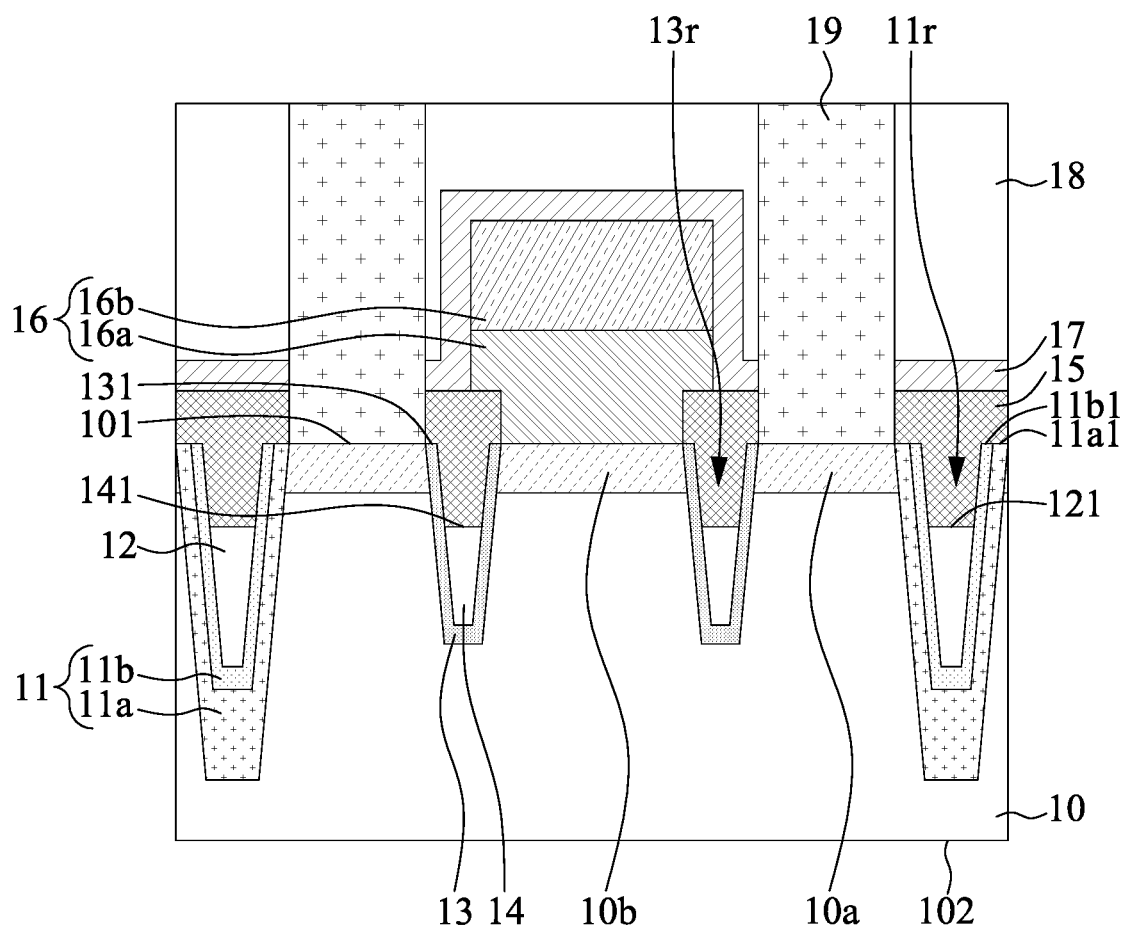
FIG. 2S illustrates one or more stages of a method of manufacturing a semiconductor device in accordance with some embodiments of the present disclosure.

Referring to FIG. 2S, a conductive material of the capacitor contact plug 19 may be formed in the opening 18r. The capacitor contact plug 19 may penetrate through the insulating layer 17 and the insulating layer 18. The conductive material may be formed by suitable techniques such as electroplating, or an electroless plating process, CVD, PVD, etc.

Figure 2T:
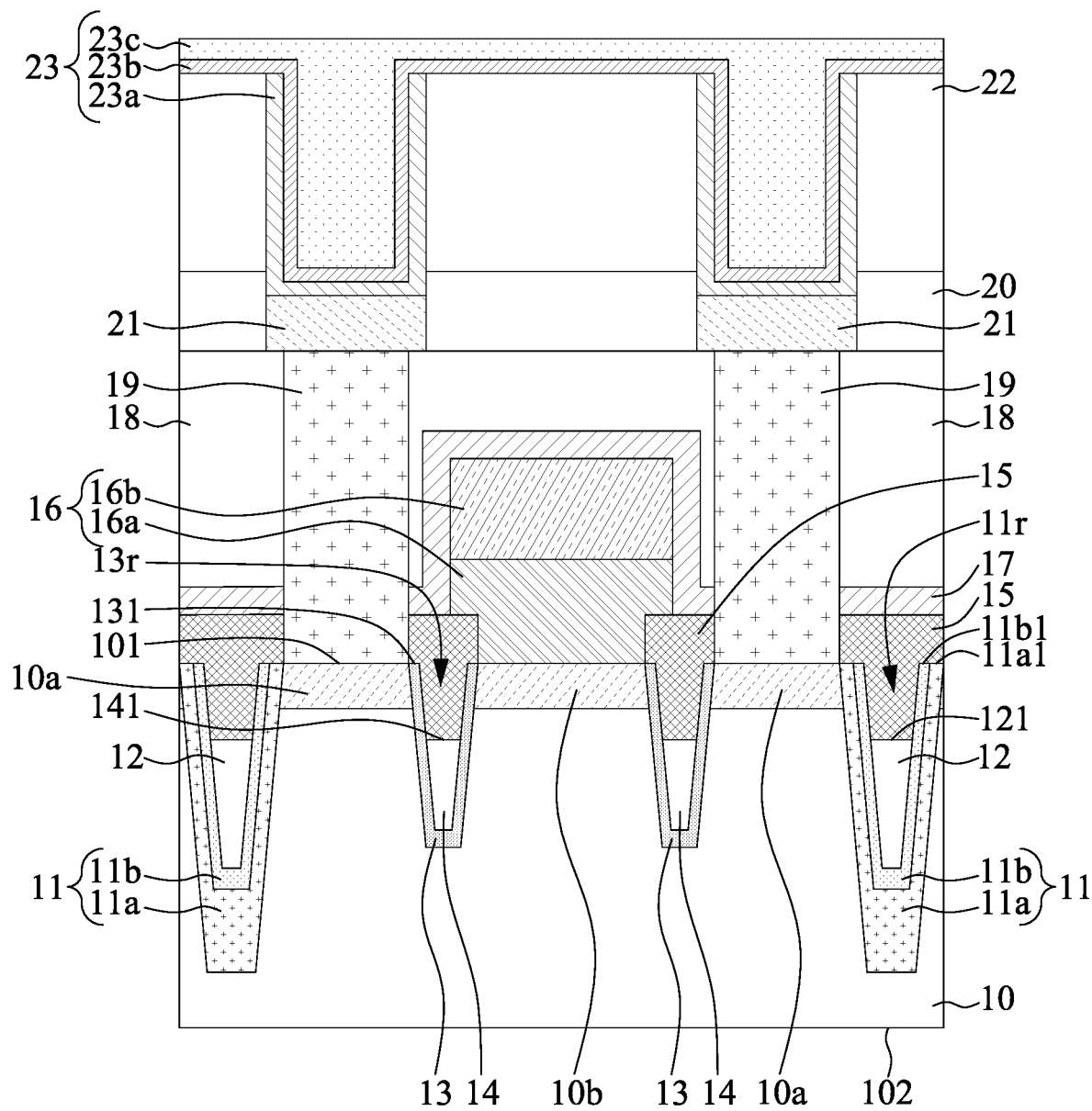
FIG. 2T illustrates one or more stages of a method of manufacturing a semiconductor device in accordance with some embodiments of the present disclosure.

Referring to FIG. 2T, similar operations may be repeated to form the capacitor contact pad 21 and other conductive elements (if any) over the capacitor contact plug 19. The insulating layer 20 and the insulating layer 22 may disposed on the insulating layer 18. An opening may be formed in the insulating layer 20 and the insulating layer 22.

The capacitor 23 may be disposed in the opening defined by the insulating layer 20 and the insulating layer 22. For example, the electrode material of the bottom electrode 23a may be disposed in the opening by, for example, plating, electroless plating, printing, CVD, or other suitable operations. The insulating material of the insulating layer 23b may be disposed on the inside of the bottom electrode 23a by, for example, CVD. The electrode material of the top electrode 23c may be disposed in the opening by, for example, plating, electroless plating, printing, CVD, or other suitable operations.

In some embodiments, subsequent to the formation of the capacitor 23, a wiring layer (not shown in the figures) may be formed on the capacitor 23. For example, the wiring layer may have a multilayer wiring structure which includes a plurality of wiring layers and interlayer insulating films.

Figure 3:
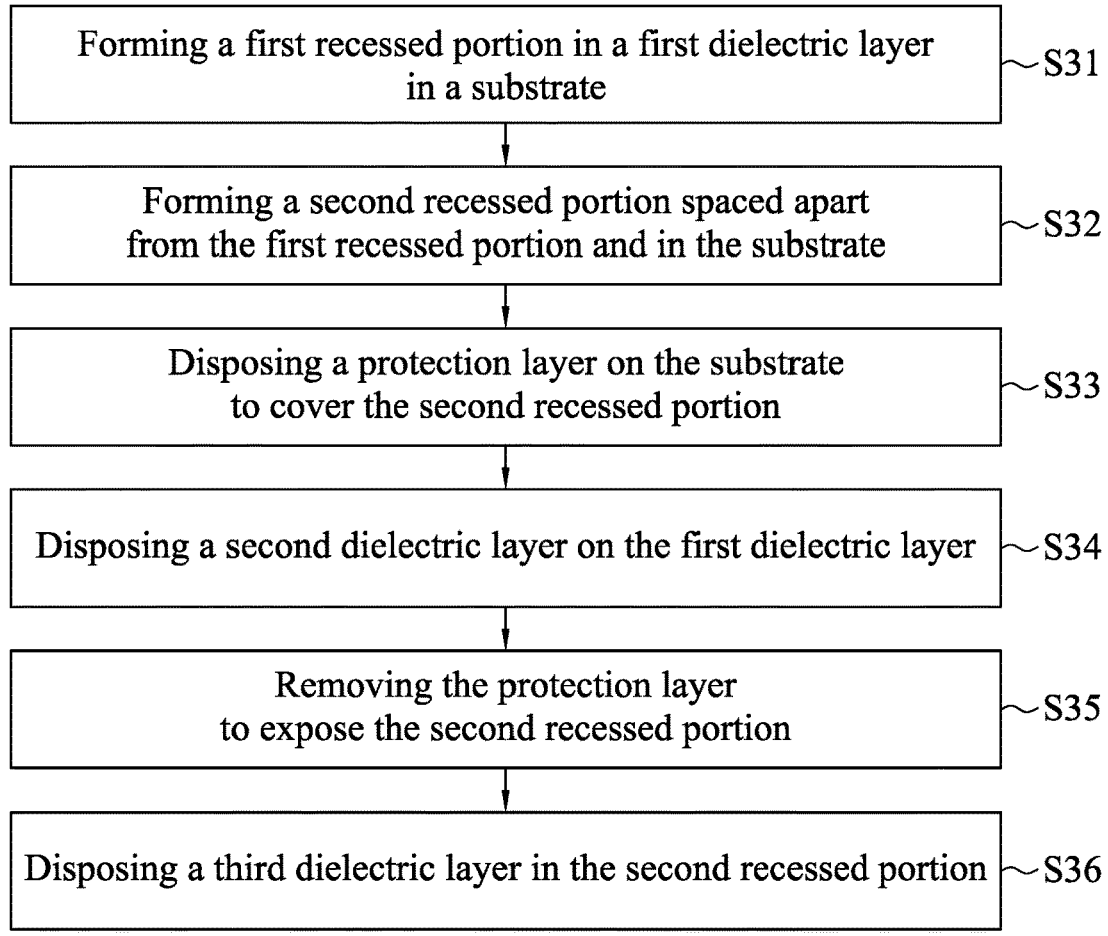
FIG. 3 illustrates a flow chart of a method of manufacturing a semiconductor device in accordance with some embodiments of the present disclosure.

FIG. 3 illustrates a flow chart of a method 30 of manufacturing a semiconductor device in accordance with some embodiments of the present disclosure.

In some embodiments, the method 30 may include a step S31, forming a first recessed portion in a first dielectric layer in a substrate. For example, as shown in FIG. 2B, the recessed portion 11r may be formed in the sublayer 11a in the substrate 10.

In some embodiments, the method 30 may include a step S32, forming a second recessed portion spaced apart from the first recessed portion and in the substrate. For example, as shown in FIG. 2B, the recessed portion 13r may be formed in the substrate 10. The recessed portion 13r is spaced apart from the recessed portion 11r.

In some embodiments, the method 30 may include a step S33, disposing a protection layer on the substrate to cover the second recessed portion. For example, as shown in FIG. 2C, the protection layer 24 may be disposed on the substrate 10 to cover the recessed portion 13r.

In some embodiments, the method 30 may include a step S34, disposing a second dielectric layer on the first dielectric layer. For example, as shown in FIG. 2F, the sublayer 11b may be disposed on the sublayer 11a.

In some embodiments, the method 30 may include a step S35, removing the protection layer to expose the second recessed portion. For example, as shown in FIG. 2H, the protection layer 24 may be removed from the substrate 10, and the recessed portion 13r may be exposed.

In some embodiments, the method 30 may include a step S36, disposing a third dielectric layer in the second recessed portion. For example, as shown in FIG. 2I, the dielectric layer 13 may be disposed in the recessed portion 13r.

One aspect of the present disclosure provides a semiconductor device. The semiconductor device includes a substrate having a surface and a first dielectric layer extending from the surface of the substrate into the substrate. The semiconductor device also includes a second dielectric layer disposed on the first dielectric layer and extending from the surface of the substrate into the substrate and a first conductive layer disposed in the substrate and separated from the substrate by the first dielectric layer and the second dielectric layer.

Another aspect of the present disclosure provides a semiconductor device. The semiconductor device includes a substrate having a surface, a first dielectric layer extending from the surface of the substrate into the substrate, and a first conductive layer disposed in the substrate and separated from the substrate by the first dielectric layer. The semiconductor device also includes a second dielectric layer extending from the surface of the substrate into the substrate and a second conductive layer disposed in the substrate and separated from the substrate by the second dielectric layer. The first dielectric layer and the second dielectric layer have different thicknesses.

Another aspect of the present disclosure provides a method of manufacturing a semiconductor device. The method includes forming a first recessed portion in a first dielectric layer in a substrate and forming a second recessed portion spaced apart from the first recessed portion and in the substrate. The method also includes disposing a protection layer on the substrate to cover the second recessed portion and disposing a second dielectric layer on the first dielectric layer.

By forming two dielectric layers between the conductive layer and the substrate, the electric field may be reduced and hence the junction leakage current may be lowered. Interference between wordlines in different memory cells can be avoided and the charge written to the cell capacitor can be retained.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
forming a first recessed portion in a first dielectric layer in a substrate;
forming a second recessed portion spaced apart from the first recessed portion and in the substrate;
disposing a protection layer on the substrate to cover the second recessed portion; and
disposing a second dielectric layer on the first dielectric layer.

2. The method of claim 1, wherein the first recessed portion is deeper than the second recessed portion.

3. The method of claim 1, wherein the first dielectric layer is disposed by a chemical vapor deposition (CVD) process.

4. The method of claim 1, wherein the second dielectric layer is disposed by an atomic layer deposition (ALD) process.

5. The method of claim 1, further comprising:
removing the protection layer to expose the second recessed portion; and
disposing a third dielectric layer in the second recessed portion.

6. The method of claim 5, wherein the third dielectric layer is disposed by a thermal oxidation process.

7. The method of claim 5, further comprising:
forming a first conductive layer on the second dielectric layer, wherein the first conductive layer is separated from the substrate by the first dielectric layer and the second dielectric layer.

8. The method of claim 7, further comprising:
forming a second conductive layer on the third dielectric layer, wherein the second conductive layer is separated from the substrate by the third dielectric layer.

9. The method of claim 8, wherein the first conductive layer and the second conductive layer comprises wordlines and are configured to address different memory cells.

10. The method of claim 8, wherein the first dielectric layer comprises a first sublayer and a second sublayer disposed between the first sublayer and the first conductive layer.

11. The method of claim 10, wherein a density of the second sublayer is different from a density of the first sublayer.

12. The method of claim 10, wherein a density of the second sublayer is greater than a density of the first sublayer.

13. The method of claim 10, wherein a density of the second dielectric layer is lower than a density of the second sublayer and higher than a density of the first sublayer.

14. The method of claim 10, wherein a top surface of the first sublayer and a top surface of the second sublayer are substantially coplanar.

15. The method of claim 10, wherein the first conductive layer comprises a passing wordline and the second conductive layer comprises an active wordline.

16. The method of claim 10, wherein the first conductive layer and the second conductive layer are configured to receive different voltages.

17. The method of claim 1, wherein a thickness of the first dielectric layer is greater than a thickness of the second dielectric layer.

* * * * *